(12) United States Patent
Fast

(10) Patent No.: US 6,615,909 B2
(45) Date of Patent: Sep. 9, 2003

(54) CORRUGATED MATRIX HEAT SINK FOR COOLING ELECTRONIC COMPONENTS

(75) Inventor: David W. Fast, Milton (CA)

(73) Assignee: Thermal Form & Function, Manchester, MA (US)

(*) Notice: Subject to any disclaimer, the term of this patent is extended or adjusted under 35 U.S.C. 154(b) by 0 days.

(21) Appl. No.: 09/901,243

(22) Filed: Jul. 9, 2001

(65) Prior Publication Data

US 2002/0029876 A1 Mar. 14, 2002

Related U.S. Application Data

(60) Provisional application No. 60/217,088, filed on Jul. 10, 2000.

(51) Int. Cl.[7] .................................................. H05K 7/20
(52) U.S. Cl. ........................ 165/80.3; 165/185; 361/704
(58) Field of Search ............................... 165/80.3, 185; 361/697, 704, 710; 257/719, 722; 174/16.3

(56) References Cited

U.S. PATENT DOCUMENTS

| | | | | |
|---|---|---|---|---|
| 3,552,488 A | * | 1/1971 | Grill et al. | 165/165 |
| 4,270,604 A | * | 6/1981 | Nakamura | 165/185 |
| 4,884,631 A | * | 12/1989 | Rippel | 165/185 |
| 5,558,155 A | * | 9/1996 | Ito | 165/185 |
| 5,937,517 A | * | 8/1999 | Smith et al. | 29/521 |
| 6,321,451 B1 | * | 11/2001 | Lee et al. | 165/80.3 |

* cited by examiner

*Primary Examiner*—Allen Flanigan
(74) *Attorney, Agent, or Firm*—Barbara Joan Haushalter

(57) ABSTRACT

An improved heat sink is used to cool electrical and electronic components that generate heat. The heat sink comprises at least one primary corrugated fin pack having a continuous series of vertically extending fins defining channels between adjacent pairs of the vertically extending fins. At least one secondary corrugated fin pack fits within the channels of the primary corrugated fin pack, creating a fin pack matrix. The fin pack matrix is then attached to a base plate.

20 Claims, 2 Drawing Sheets

PRIOR ART

CORRUGATED MATRIX HEAT SINK FOR COOLING ELECTRONIC COMPONENTS

RELATED APPLICATIONS

This is a regularly filed application, based on provisional application Ser. No. 60/217,088, filed Jul. 10, 2000.

TECHNICAL FIELD

The present invention relates to cooling of electrical and electronic components, and more particularly, to a corrugated matrix heat sink to cool electrical and electronic components.

BACKGROUND OF THE INVENTION

Electrical and electronic components (e.g. microprocessors, IGBT's, power semiconductors etc.) generate heat which must be removed for reliable operation and long life of the components. As the dissipation of heat produced from electronic components continues to escalate, it is increasingly necessary to provide more effective and efficient means of cooling these devices.

One method of removing heat from electronic components is to use a heat sink. A heat sink, which comprises a flat plate with a number of extended vertical fins, has been the focus of attention for many years (20–30) as the primary means of dissipating the heat from electronic components to the surrounding ambient air. Much time and effort has been put into improving heat sinks from both a design optimization aspect, as well as from the manufacturing perspective. What has happened is that the theoretical optimization of the basic geometrical parameters (fin thickness, fin height and number of fins or fin spacing) has resulted in either difficult-to-manufacture (and therefore high cost) or even unmanufacturable heat sink configurations. The problem stems from the fact that often, the optimum heat sink requires a fin density and fin thickness that is unattainable when constrained to the standard manufacturing practices.

Currently, there are five main approaches to manufacturing heat sinks, namely: extrusions, castings, micro-forging, metal-to-metal fabricated fin and corrugated fin. Each of these methods are restricted in their fin designs such that the air passages between the fins are long and narrow (i.e., similar to parallel plates).

The extrusion process involves pushing a billet of heated material through a hollowed tool (called a die) to form a profile. The design of the tool is very critical because the high forces required to push the material through the tool places a lot of stress on the tool, and if not designed properly, the tool will break. The design constraints on the tool are such that the heat sink profile is very difficult to produce, especially when very thin, tall and densely packed fins are required. Currently, extrusion ratios (fin height to gap between fins) of 6:1 and 8:1 are considered easy and are available from many extruders. There are a handful of extruders that can extrude 11:1 and even 15:1, but only within a certain overall size envelope. Presently, the thermal demand in the electronic marketplace can be for heat sinks in the 25:1 and even up to the 40:1 ratio range. These ratios are currently impossible for extruders to obtain.

The casting process involves pouring molten metal into a die so that the metal conforms to the shape cut into the die. The disadvantages of this process are three-fold, namely (1) the thermal characteristics of the material required for this process are lower than the material requirements of the other processes, (2) the fin dimensions and fin density are restricted similar to that of extrusions, but because of mold release issues, and (3) the cost of this process is such that it only lends itself to very high volume applications.

Micro forging is the process of forming a shape by repeatedly pressing (with a high force press) a heated billet into the die cavity. This process also has fin dimension and fin density limitations, as well as high volume requirements.

Fabricated fin heat sinks are made by taking individual fins and joining them to a base plate by an attachment method (either a metal-to-metal deformation process, like swaging, or bonded with an epoxy). This process has surpassed the fin height to gap ratio restrictions of the other processes, but still cannot provide the ratios achievable using corrugated fin technology.

Corrugated fin heat sinks are made by joining a fin pack to a base plate by bonding, soldering or brazing. The fin pack is a continuous piece of sheet metal that has been folded into a corrugated shape. This method releases the fin thickness and density limitations of the other four methods and permits the theoretical optimums to be manufactured. One disadvantage, however, is that maximum fin heights of only 4" are currently achievable. Nevertheless, heat sinks requiring this fin height are not a common demand in the marketplace. Another disadvantage of this type of heat sink is that for long flow lengths, the high fin densities can incur very high pressure drops which are a detriment to the air flow and resulting cooling capacity.

One common constraint to all the heat sink designs manufactured by the above processes is that the designs primarily utilize the fins in the vertical direction only, i.e., perpendicular to the base plate. A few extrusions and/or fabricated-fin heat sink designs have utilized space in the horizontal direction (perpendicular to the fins), but in a very minor fashion (i.e., small, thick secondary fins, serrations on the fins, or corrugated fins themselves). None of the above designs effectively employ the cooling benefits available by utilizing surface area in the direction perpendicular to the fins.

Therefore, it is the object of this invention to provide a new heat.

It is seen then that there exists a continuing need for an improved method of removing heat from electrical or electronic components, particularly a heat sink design that offers significant manufacturing and ensuing cost advantages to the prior art.

SUMMARY OF THE INVENTION

This need is met by the present invention, which proposes the novel approach of embedding small fin packs, i.e., corrugated fin units, in between the channels of a larger fin pack.

In accordance with one aspect of the present invention, an improved heat sink provides cooling away from the surface of electrical and electronic components. The heat sink comprises at least one primary corrugated fin pack having a continuous series of vertically extending fins defining channels between adjacent pairs of the vertically extending fins. At least one secondary corrugated fin pack fits within the channels of the primary corrugated fin pack, creating a fin pack matrix. The fin pack matrix is then attached to a base plate.

Accordingly, it is an object of the present invention to provide an improved heat sink design for cooling electrical and electronic components. The features of the improvement according to the invention, over the heat sink formed by alternately stacking and brazing together corrugated fins and separator sheets, reside in the reduced number of components and ease of assembly which ultimately result in a lower overall unit cost.

Other objects and advantages of the invention will be apparent from the following description, the accompanying drawings and the appended claims.

DETAILED DESCRIPTION OF THE PREFERRED EMBODIMENTS

Figure 1:
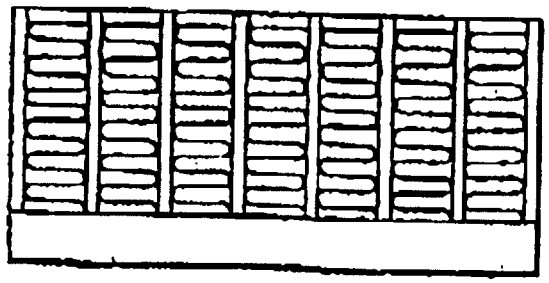
FIG. 1 is a front view of a prior art stacked corrugated fin heat sink.

Referring now to FIG. 1, the most effective prior art heat sink design, utilizing the greatest amount of surface area, involves a number of corrugated fins and separator sheets that are alternately stacked together and brazed together. This method permits the optimum usage of material by being able to optimize the fin thicknesses in the vertical and horizontal flow paths independently. Essentially, this configuration has the potential of offering a heat sink with the best thermal performance for the lowest Pressure drop, lowest weight and smallest size. However, one disadvantage to this design is the requirement of so many individual pieces to hold and braze together, which is labor intensive and therefore costly. The fact that this configuration is currently the most optimum configuration but least used in the heat sink market indicates that it is too costly to manufacture, thereby reducing its market acceptability and success.

Figure 2:
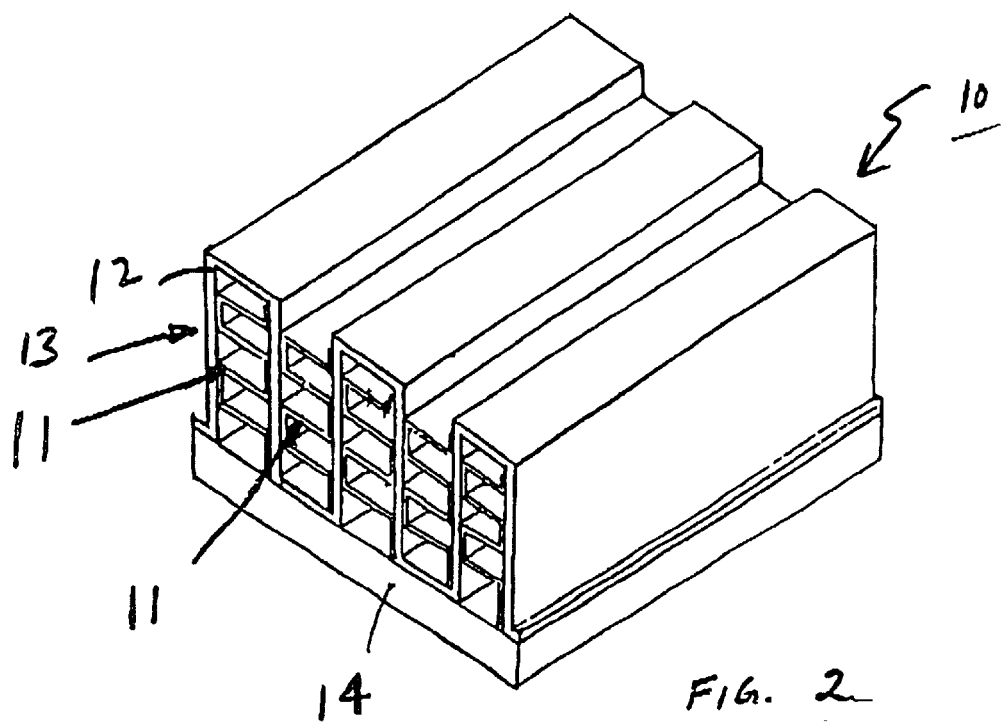
FIG. 2 is an isometric view of a preferred embodiment of a heat sink constructed in accordance with the present invention.

The present invention proposes a corrugated matrix heat sink for enhanced heat dissipation and improved manufacturability. Referring now to FIG. 2, illustrated therein is a preferred embodiment of a heat sink 10 made in accordance with the subject invention. Heat sink 10 comprises a plurality of small, corrugated fin packs 11 embedded in the channels of a thicker, wider spaced corrugated fin pack 12. Primary fin pack 12 is comprised of multiple vertical extending fins 15. Between adjacent pairs of fins 15, the plurality of secondary fin packs 11 can be inserted. The secondary fin packs 11 are arranged between the fins 15 such that fins 18 of fin packs 11 are in a perpendicular relationship to the fins 15 of fin pack 12. The fin pack assembly comprising fin packs 11 and 12, hereinafter referred to as the fin pack matrix 13, is then attached to a thicker base plate 14. Fin packs 11 and 12 are typically made of aluminum, copper, or other heat dissipating metal or metal alloy.

Figure 3:
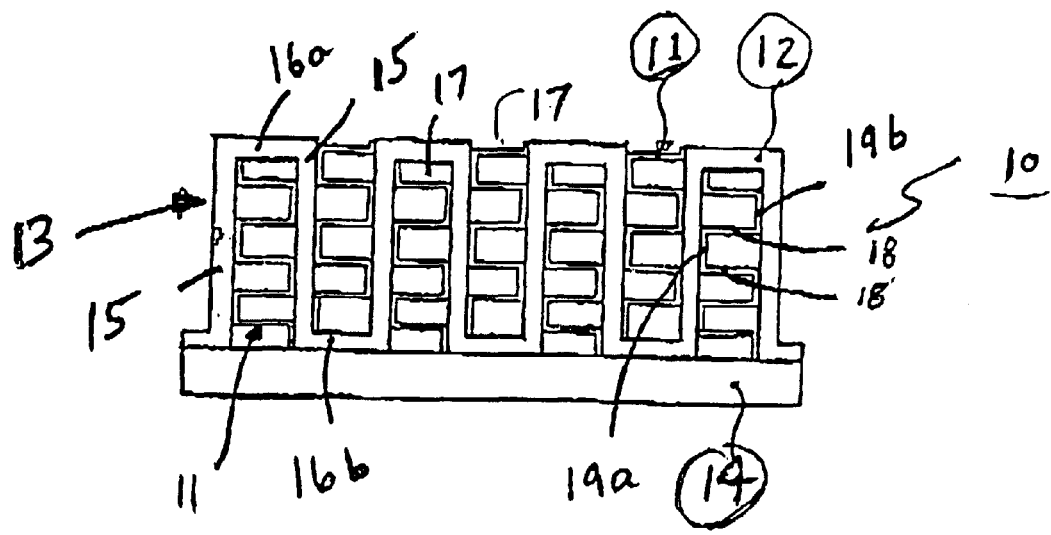
FIG. 3 is a front view of the preferred embodiment of the heat sink according to the present invention.

Referring now to FIG. 3, fin pack 12 preferably comprises a continuous sheet folded into spaced, vertically extending sections 15 connected by horizontally extending top sections 16a and bottom sections 16b. Adjacent vertical sections 15 define channels 17 for receiving fin packs 11. Each of fin packs 11 preferably comprise a continuous sheet folded into horizontally extending sections 18 connected by connecting sections 19a and 19b.

Once the secondary fin packs 11 are situated within the channels of the primary fin pack 12, the secondary fin packs 11 are secured to the primary fin pack 12 by any suitable attachment method. Fin pack matrix 13 is preferably assembled by stretching fin pack 12 in order to open channels 17 wider and allow unrestricted placement of the fin packs 11, and then compressing the entire assembly with the force required by the attachment method. The fin packs 11 can be attached to the fin pack 12 by any suitable means, such as the conventional methods of brazing, soldering or epoxy bonding. Concurrently, or subsequently, the corrugated fin pack matrix 13 can be attached to the base plate 14 by any suitable method, such as by brazing, soldering or bonding.

Figure 4:
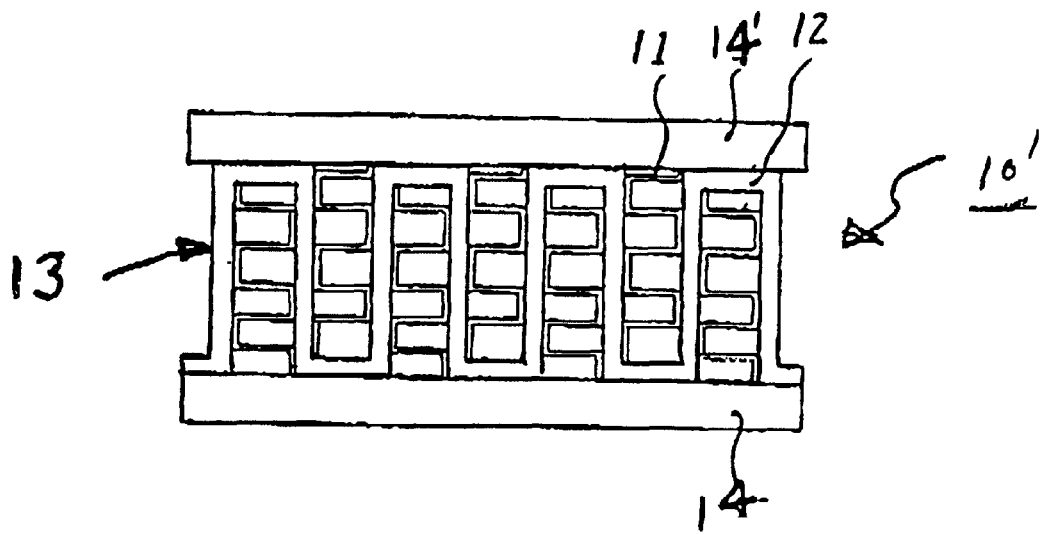
FIG. 4 is a front view of an alternative embodiment of the heat sink according to the present invention.

Referring to FIG. 4, shown therein is a heat sink 10' made in accordance with an alternative embodiment of the present invention. Heat sink 10' comprises a fin pack matrix 13 like that of the preferred embodiment, sandwiched between a first base plate 14 and a second base plate 14'.

While it is most common to have only one base plate 14 as demanded by the heat sink market, occasionally, a base plate on either side (i.e., 14 and 14') of fin pack matrix 13 is desired for the mounting of electronic components. It will be obvious to those skilled in the art that other embodiments are possible within the scope of the present invention.

As has been shown, manufacturing a heat sink by embedding a small, corrugated fin pack inside the channels of a larger corrugated fin pack offers significant manufacturing and resulting cost advantages. The thermal advantages lie in the optimum selection of the fin thickness and fin density of the two fin packs comprising the heat-dissipating matrix. Those skilled in the art will understand that the optimum values will depend on all of the unique constraints that are particular to each given application. These constraints can include the selected fan, weight and/or size constraints, required heat dissipation, maximum component junction temperature, maximum ambient cooling air temperature, and cleanliness of the operating environment. The manufacturing and cost advantages lie in the assembly ease and resulting increased productivity.

Having described the invention in detail and by reference to the preferred embodiment thereof, it will be apparent that other modifications and variations are possible without departing from the scope of the invention defined in the appended claims.

What is claimed is:

1. An improved heat sink comprising:
   at least one primary corrugated fin pack having a continuous series of primary vertically extending fins defining channels between adjacent pairs of the primary vertically extending fins;
   at least one secondary corrugated fin pack having a continuous series of secondary vertically extending fins, wherein the at least one secondary corrugated fin pack fits within the channels of the at least one primary corrugated fin pack;
   a fin pack matrix created by inserting the at least one secondary corrugated fin pack in between adjacent pairs of the vertically extending fins of the at least one primary corrugated fin pack;
   at least one base plate, wherein heat is conducted from the at least one base plate into the at least one primary corrugated fin pack and then into the at least one secondary corrugated fin pack; and
   means for attaching the fin pack matrix to the at least one base plate.

2. An improved heat sink as claimed in claim 1 wherein the at least one primary corrugated fin pack comprises one primary corrugated fin pack.

3. An improved heat sink as claimed in claim 1 wherein the at least one secondary corrugated fin pack comprises a plurality of secondary corrugated fin packs for insertion in the channels of the at least one primary corrugated fin pack.

4. An improved heat sink as claimed in claim 3 wherein the plurality of secondary corrugated fin packs are arranged within the channels of the at least one primary corrugated fin pack such that the primary vertically extending fins of the at least one primary corrugated fin pack are in a perpendicular relationship to the secondary vertically extending fins of the plurality of secondary corrugated fin packs.

5. An improved heat sink as claimed in claim 1 wherein the at least one primary corrugated fin pack comprises a heat dissipating metal or metal alloy.

6. An improved heat sink as claimed in claim 5 wherein the at least one primary corrugated fin pack comprises aluminum.

7. An improved heat sink as claimed in claim 5 wherein the at least one primary corrugated fin pack comprises copper.

8. An improved heat sink as claimed in claim 1 wherein the at least one secondary corrugated fin pack comprises a heat dissipating metal or metal alloy.

9. An improved heat sink as claimed in claim 8 wherein the at least one secondary corrugated fin pack comprises aluminum.

10. An improved heat sink as claimed in claim 8 wherein the at least one secondary corrugated fin pack comprises copper.

11. A method for cooling one or more heat-generating electrical or electronic components, the method comprising the steps of:

providing at least one primary corrugated fin pack having vertically extending fins defining channels between adjacent pairs of the vertically extending fins;

providing at least one secondary corrugated fin pack having vertically extending fins, wherein the vertically extending fins of the at least one primary corrugated fin pack are thicker and wider-spaced than the vertically extending fins of the at least one secondary corrugated fin pack;

inserting the at least one secondary corrugated fin pack in the channels of the at least one primary corrugated fin pack to create a fin pack matrix; and attaching the fin pack matrix to at least one base plate, wherein heat is conducted from the at least one base plate into the at least one primary corrugated fin pack and then into the at least one secondary corrugated fin pack.

12. A method as claimed in claim 11 wherein the at least one primary corrugated fin pack comprises one primary corrugated fin pack.

13. A method as claimed in claim 11 wherein the at least one secondary corrugated fin pack comprises a plurality of secondary corrugated fin packs for insertion in the channels of the at least one primary corrugated fin pack.

14. A method as claimed in claim 11 further comprising the step of arranging the at least one secondary corrugated fin pack within the channels of the at least one primary corrugated fin pack such that the primary vertically extending fins of the at least one primary corrugated fin pack are in a perpendicular relationship to the secondary vertically extending fins of the at least one secondary corrugated fin pack.

15. A method as claimed in claim 11 wherein the at least one primary corrugated fin pack comprises a heat dissipating metal or metal alloy.

16. A method as claimed in claim 15 wherein the at least one primary corrugated fin pack comprises aluminum.

17. A method as claimed in claim 15 wherein the at least one primary corrugated fin pack comprises copper.

18. A method as claimed in claim 11 wherein the at least one secondary corrugated fin pack comprises a heat dissipating metal or metal alloy.

19. A method as claimed in claim 18 wherein the at least one secondary corrugated fin pack comprises aluminum.

20. A method as claimed in claim 18 wherein the at least one secondary corrugated fin pack comprises copper.

* * * * *